United States Patent
Shilshtut

(10) Patent No.: US 7,948,260 B1
(45) Date of Patent: May 24, 2011

(54) METHOD AND APPARATUS FOR ALIGNING THE PHASES OF DIGITAL CLOCK SIGNALS

(75) Inventor: Radimir Shilshtut, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/789,234

(22) Filed: May 27, 2010

(51) Int. Cl.
*H03K 19/003* (2006.01)

(52) U.S. Cl. .................. 326/9; 326/10; 326/15; 326/93

(58) Field of Classification Search .................. None
See application file for complete search history.

(56) References Cited

U.S. PATENT DOCUMENTS

2007/0090887 A1* 4/2007 Seefeldt et al. .................. 331/17
2010/0271090 A1* 10/2010 Rasmussen .................... 327/158

* cited by examiner

*Primary Examiner* — Anh Q Tran
(74) *Attorney, Agent, or Firm* — Kin-Wah Tong

(57) ABSTRACT

A method and apparatus for aligning the phases of digital clock signals are disclosed. For example, a phase alignment circuit according to one embodiment includes a frequency adjuster comprising a first plurality of inputs, where at least some of the first plurality of inputs are coupled to an output of a digital clock of an integrated circuit, a phase adjuster comprising a second plurality of inputs, where at least some of the second plurality of inputs are coupled to a plurality of outputs of the frequency adjuster, and an XOR gate comprising a third plurality of inputs, each of the third plurality of inputs being coupled to one of the plurality of outputs of the frequency adjuster.

20 Claims, 4 Drawing Sheets

METHOD AND APPARATUS FOR ALIGNING THE PHASES OF DIGITAL CLOCK SIGNALS

FIELD OF THE INVENTION

This invention relates generally to integrated circuits and relates more particularly to clocking for integrated circuit applications.

BACKGROUND

In certain applications, e.g., space applications, clocking of an integrated circuit can be interrupted, e.g., by single event upsets or other environmental conditions. Such interruptions may cause undesirable results in an integrated circuit.

SUMMARY

In one embodiment, a method and apparatus for aligning the phases of digital clock signals are disclosed. For example, a phase alignment circuit according to one embodiment includes a frequency adjuster comprising a first plurality of inputs, where at least some of the first plurality of inputs are coupled to an output of a digital clock of an integrated circuit, a phase adjuster comprising a second plurality of inputs, where at least some of the second plurality of inputs are coupled to a plurality of outputs of the frequency adjuster, and an XOR gate comprising a third plurality of inputs, each of the third plurality of inputs being coupled to one of the plurality of outputs of the frequency adjuster.

In various embodiments, the XOR gate can further include an output coupled to at least one of the first plurality of inputs and to at least one of the second plurality of inputs; the phase adjuster can further include a plurality of outputs coupled to a logic fabric of the integrated circuit; the frequency adjuster can include a counter. The frequency adjuster can include a divider; the frequency adjuster can include a multiplexed global clock buffer; the phase adjuster can include a digital clock manager; the phase adjuster can include a phase-locked loop; the phase adjuster can include a phase-matched clock divider; the phase adjuster can include an architecture-independent global buffer; and/or the phase adjuster can include a multiplexed global clock buffer.

According to another embodiment, a method of generating a plurality of clock signals is provided. The method includes: receiving a plurality of copies of an input clock signal by a frequency adjuster; confirming that the plurality of copies are phase-aligned; and generating the plurality of clock signals in accordance with the plurality of copies when the plurality of copies is phase-aligned.

In various embodiments, the method can further include dividing down the plurality of copies prior to the confirming; the confirming can include applying an XOR function to the plurality of copies to produce a signal, wherein the plurality of copies is deemed to be phase-aligned when the signal is low, and the plurality of copies is not deemed to be phase-aligned when the signal is high; the method can further include resetting the frequency adjuster that directly receives the plurality of copies prior to the generating; the method can further include resetting a phase adjuster that adjusts phases of the plurality of copies prior to the generating; the plurality of copies can be frequency aligned prior to the receiving; the method can further include outputting the plurality of clock signals to a logic fabric of an integrated circuit; and/or the plurality of clock signals can be frequency-aligned.

Also provided is a non-transitory computer-readable storage medium having stored thereon a plurality of instructions, the plurality of instructions including instructions which, when executed by a processor, cause the processor to perform steps of a method for generating a plurality of clock signals. The method includes: receiving a plurality of copies of an input clock signal by a frequency adjuster; confirming that the plurality of copies are phase-aligned; and generating the plurality of clock signals in accordance with the plurality of copies when the plurality of copies is phase-aligned.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION

Clocking for certain applications, e.g., space applications, is conventionally limited to using clock sources that are running at the frequency of the integrated circuit, with no digital clock manager, phase-locked loop, or phase-matched clock divider. The described embodiments allow one to choose many different clock source frequencies and to then divide down to the correct frequency that can be used directly by the integrated circuit. Further embodiments allow one to use a digital clock manager, phase-locked loop, or phase-matched clock divider to create other useful frequencies. Thus, multiple copies of the clock signals are available to the integrated circuit to ensure that the integrated circuit operates as intended. Moreover, when clock phase alignment is indicated, a method of resetting the integrated circuit is provided.

Figure 1:
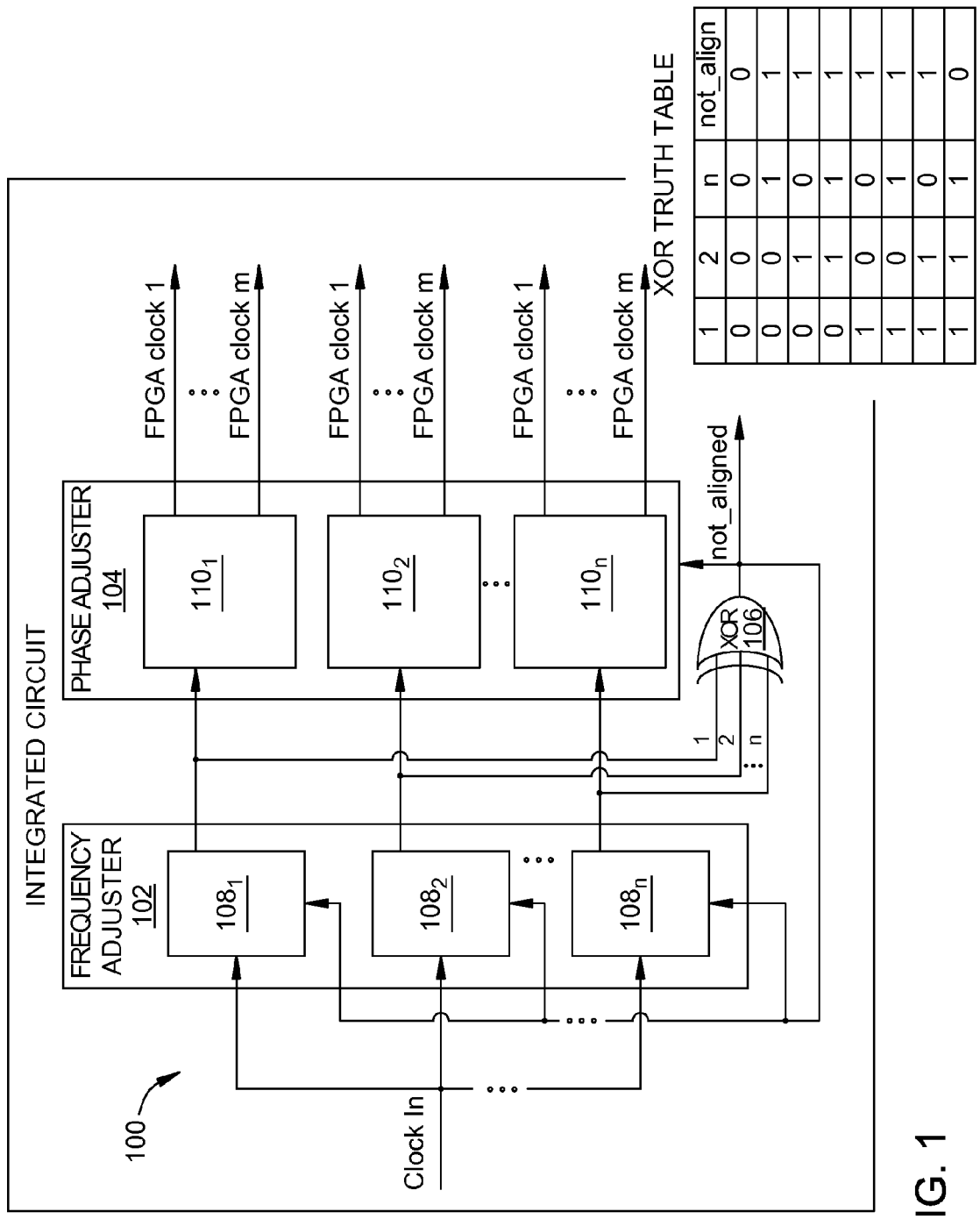
FIG. 1 is a schematic diagram illustrating one embodiment of digital clock phase alignment circuit.

FIG. 1 is a schematic diagram illustrating one embodiment of the digital clock phase alignment circuit 100. The circuit 100 may be integrated into the logic fabric of an integrated circuit such as, for example, a programmable logic device (PLD) or an application-specific integrated circuit (ASIC). A PLD, in turn, may comprise a field programmable gate array (FPGA), or the like. As illustrated, the circuit 100 comprises a frequency adjuster 102, a phase adjuster 104, and an XOR gate 106.

In one embodiment, the frequency adjuster 102 comprises a circuit element that is capable of adjusting the frequency of an input clock signal, such as, for example, a counter, a divider, or a multiplexed global clock buffer (BUFGMUX). The frequency adjuster 102 may comprise a first plurality of adjusting elements $108_1$-$108_n$ (hereinafter collectively referred to as "adjusting elements 108"). Each of the adjusting elements 108 comprises an input that is coupled to the output of a digital clock. Each of the adjusting elements 108 also comprises an output that is coupled to an input of the phase adjuster 104. Each of the outputs of the adjusting elements 108 is additionally coupled to an input of the XOR gate 106.

In one embodiment, the phase adjuster 104 comprises a circuit element that is capable of adjusting the phase of an input clock signal, such as, for example, a digital clock manager (DCM), a phase-locked loop (PLL), a phase-matched clock divider (PMCD), an architecture-independent global buffer (BUFG), or a BUFGMUX.

The phase adjuster 104 comprises a second plurality of adjusting elements $110_1$-$110_n$ (hereinafter collectively referred to as "adjusting elements 110"). Each of the adjusting elements 110 comprises an input that is coupled to an output of one of the adjusting elements 108. In addition, each of the adjusting elements 110 comprises a plurality of outputs (e.g., m outputs) that are coupled to the logic fabric of the integrated circuit 100.

In one embodiment, the XOR gate 106 comprises a plurality of inputs, each of which is coupled to an output of one of the adjusting elements 108. The XOR gate 106 also comprises an output that is coupled to an input of the phase adjuster 104. In addition, the output of the XOR gate 106 is also coupled to an input on each of the adjusting elements 108.

The digital clock phase alignment circuit 100 is relatively small and simple to implement; however, as discussed in greater detail below, the circuit 100 can be used to indicate loss-of-clock events and to divide incoming clock signals while maintaining a phase relationship between incoming copies of the clock signal.

Figure 2:
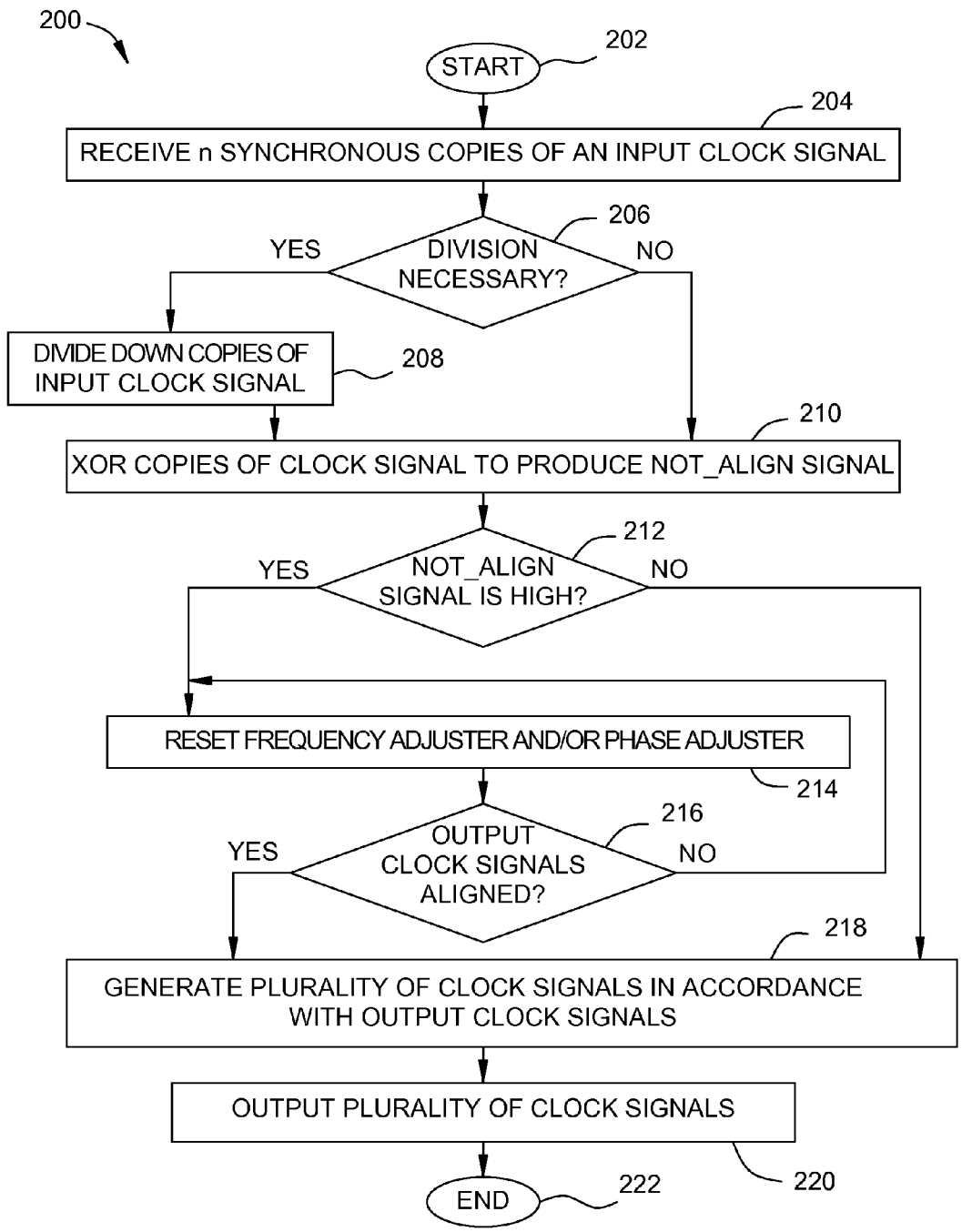
FIG. 2 is a flow diagram illustrating one embodiment of a method for aligning the phases of a digital clock.

FIG. 2 is a flow diagram illustrating one embodiment of a method 200 of aligning the phases of a digital clock. The method 200 may be implemented, for example, by the digital clock phase alignment circuit 100 illustrated in FIG. 1. As such, reference is made in the discussion of the method 200 to various components of FIG. 1. It will be appreciated, however, that application of the method 200 is not limited to the circuit configuration illustrated in FIG. 1. In addition, the method 200 may be particularly useful when employed in connection with FPGA space applications, but is not limited to use with such applications.

The method 200 is initialized at step 202 and proceeds to step 204, where the circuit 100 receives a plurality of synchronous copies (e.g., "n" copies) of an input clock signal. Specifically, each of the adjusting elements 108 in the frequency adjuster 102 receives, over its respective input, a copy of the input clock signal. Each of the copies of the input clock signal has the same frequency.

In step 206, the frequency adjuster 102 determines whether it is necessary to divide down the copies of the input clock signal. If the frequency adjuster 102 concludes in step 206 that it is necessary to divide down the copies of the input clock signal, then the adjusting elements 108 divide down the copies of the input clock signal in step 208. The copies of the input clock signal may be divided down to substantially any value; however, the divided down copies of the input clock signal all have the same frequency. The method 200 then proceeds to step 210.

Alternatively, if the frequency adjuster 102 concludes in step 206 that it is not necessary to divide down the copies of the input clock signal, then the method 200 proceeds directly to step 210. In step 210, the XOR gate 106 XORs the output clock signals that are produced by the frequency adjuster 102 (which may or may not have been divided down, depending on the outcome of step 206). The result of the XOR operation is a NOT_ALIGN signal.

In step 212, the phase adjuster 104 determines whether the NOT_ALIGN signal is high. As illustrated in the XOR truth table in FIG. 1, a high (e.g., one) NOT_ALIGN signal indicates that all of the output clock signals are not aligned, while a low (e.g., zero) NOT_ALIGN signal indicates that all of the output clock signals are aligned. An out-of-phase (or missing) clock signal may be the result of, for example, radiation effects. The illustrated XOR truth table contains information for n=3 output clock signals; however, n could equal any number, as discussed above.

If the phase adjuster 104 concludes that the NOT_ALIGN signal is high, then the frequency adjuster 102 and/or phase adjuster 104 is reset in step 214. Resetting the frequency adjuster 102 causes the output clock signals being output by the frequency adjuster 102 to be aligned; thus, the reset continues until all of the output clock signals have the same phase.

Figure 3:
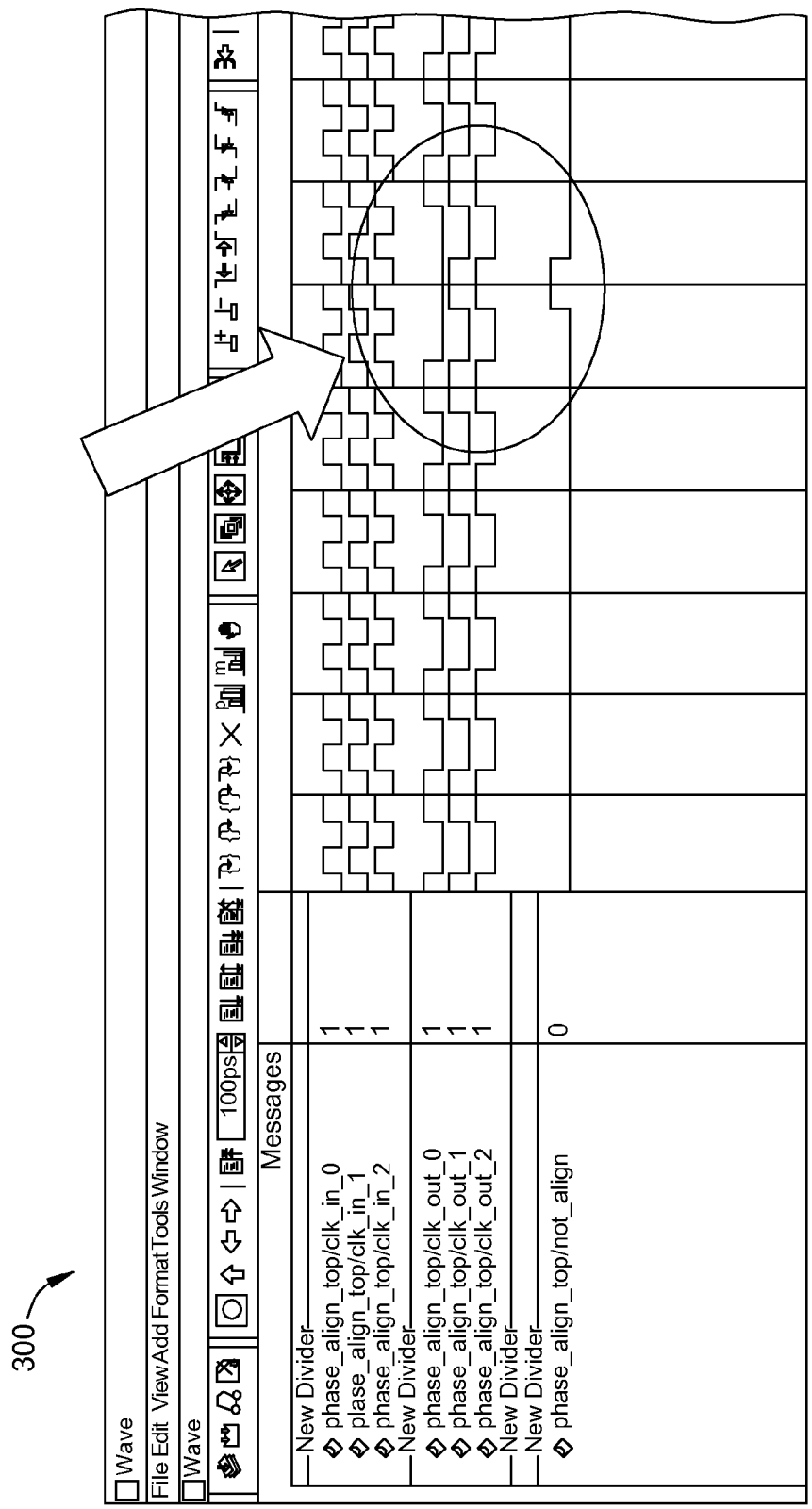
FIG. 3 is an exemplary screen shot of a graphical user interface that displays the phases of the output clock signals.

FIG. 3, for example, is a screen shot of a graphical user interface 300 that displays the phases of the output clock signals. Specifically, FIG. 3 illustrates the phases of three initially out-of-phase clock signals (i.e., "phase_align_top/clk_out_0," "phase_align_top/clk_out_1," and "phase_align_top/clk_out_2"). When the frequency adjuster 102 is reset in accordance with step 214, the phases of these three clock signals are aligned, and remain aligned as illustrated. Once the phases of the output clock signals have been aligned, the method 200 proceeds to step 216.

Alternatively, if the phase adjuster 104 concludes that the NOT_ALIGN signal is not high (i.e., the output clock signals are aligned), then method 200 proceeds directly to step 218.

In step 216, the phase adjuster 104 determines whether the output clock signals being received from the frequency adjuster 102 are now aligned. If the phase adjuster 104 concludes in step 216 that the output clock signals are not yet aligned, then the method 200 returns to step 214, and the frequency adjuster 102 and/or phase adjuster 104 continue to be held in reset. Alternatively, if the phase adjuster 104 concludes in step 216 that the output clock signals are now aligned, then the frequency adjuster 102 and/or phase adjuster 104 are taken out of reset, and the phase adjuster 104 generates a plurality of clock signals in step 218. The plurality of clock signals is generated in accordance with the aligned output clock signals being received from the frequency adjuster 102. The clock signals produced in step 218 are likewise frequency- and phase-aligned.

In step 220, the phase adjuster 104 outputs the plurality of clock signals to the logic fabric of the integrated circuit. The method 200 then terminates in step 222 or returns to step 204.

The method 200 thereby produces a plurality of versions of the integrated circuit's clock signal, all of which are available to the integrated circuit. This approach substantially ensures that if one or more clock signals are disrupted, the integrated circuit can still operate properly and/or be reset. Moreover, the NOT_ALIGN signal that is generated by the XOR gate 106 can also be used to detect the loss of clock events (which may indicate a major fault in the integrated circuit), which can be used for many applications including but not limited to space applications. In addition, when the phase adjuster 104 is a digital clock manager or a phase-locked loop, division of the copies of the input clock signals allows for the use of only certain outputs, thereby reducing jitter on the shifted clock signals. The reduced jitter, in turn, improves the stability and reliability of the integrated circuit.

Further applications of the method 200 include the generation of multiple copies of the same clock signal with voters. In this case, the voters will determine which clock domain is not functioning. The digital clock manager or phase-locked loop associated with the malfunctioning clock domain may then be reset. Alternatively, an error event that triggers a reset of the integrated circuit may be indicated.

Figure 4:
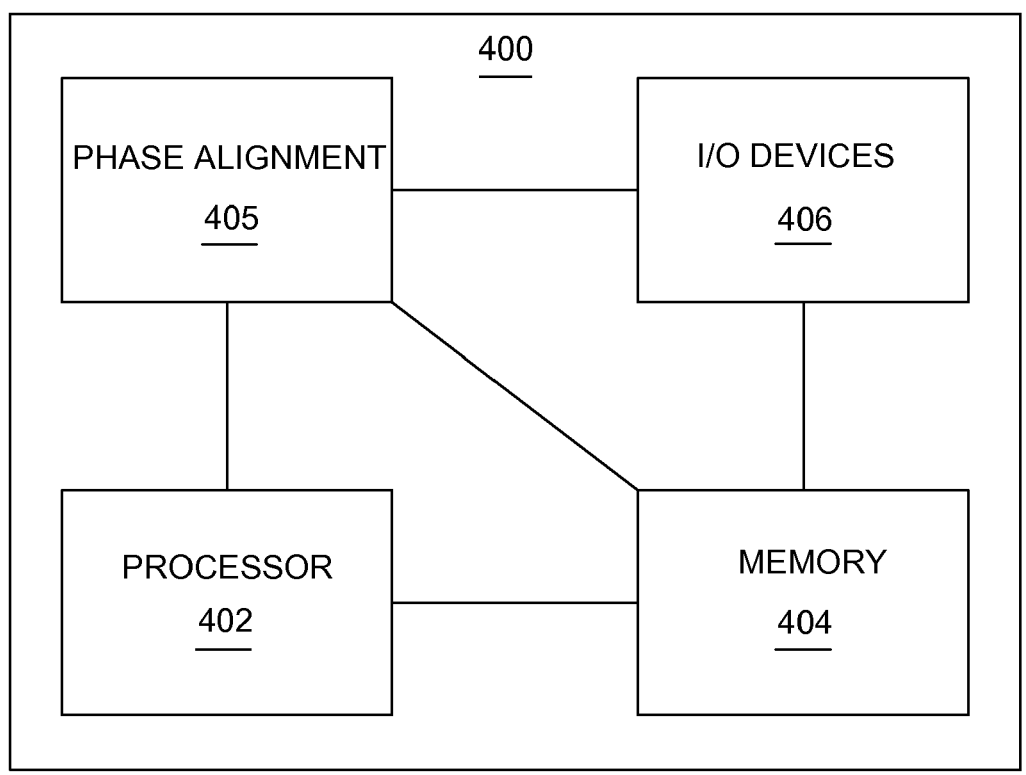
FIG. 4 depicts a high level block diagram of a general purpose computer or a computing device suitable for use in performing some or all of the functions described herein.

FIG. 4 depicts a high level block diagram of a general purpose computer or a computing device suitable for use in performing some or all of the functions described herein. The general purpose computer may incorporate, for example, in integrated circuit including a digital clock phase alignment circuit. As depicted in FIG. 4, the general purpose computer 400 comprises a processor element or processing elements 402 (e.g., a central processing unit (CPU)), a memory 404 (e.g., a random access memory (RAM) and/or a read only memory (ROM)), a phase alignment module 405 for aligning the phases of copies of a clock signal received from a logic fabric of an integrated circuit, and various input/output devices 406 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

The described embodiments can be implemented in software and/or in a combination of software and hardware (e.g., using application specific integrated circuits (ASIC), a general purpose computer, one or more portions of a PLD, or any other hardware equivalents such as microprocessors). In one embodiment, one or more steps of the present module or process for aligning the phases of digital clock signals from a digital circuit may be loaded into memory 404 and executed by processor 402 to implement the functions as discussed above. As such, the present module or process 405 for aligning the phases of digital clock signals can be stored on a non-transitory computer readable storage medium (e.g., RAM memory, magnetic or optical drive or diskette and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying figures that recite a determining operation or involve a decision do not necessarily require that both branches of the determining operation be practiced. In other words, one of the branches of the determining operation can be deemed as an optional step.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. A circuit, comprising:
a frequency adjuster comprising a first plurality of inputs, wherein at least some of the first plurality of inputs are coupled to an output of a digital clock of an integrated circuit;
a phase adjuster comprising a second plurality of inputs, wherein at least some of the second plurality of inputs are coupled to a plurality of outputs of the frequency adjuster; and
an XOR gate comprising a third plurality of inputs, each of the third plurality of inputs being coupled to one of the plurality of outputs of the frequency adjuster.

2. The circuit of claim 1, wherein the XOR gate further comprises an output coupled to at least one of the first plurality of inputs and to at least one of the second plurality of inputs.

3. The circuit of claim 1, wherein the phase adjuster further comprises a plurality of outputs coupled to a logic fabric of the integrated circuit.

4. The circuit of claim 1, wherein the frequency adjuster comprises a counter.

5. The circuit of claim 1, wherein the frequency adjuster comprises a divider.

6. The circuit of claim 1, wherein the frequency adjuster comprises a multiplexed global clock buffer.

7. The circuit of claim 1, wherein the phase adjuster comprises a digital clock manager.

8. The circuit of claim 1, wherein the phase adjuster comprises a phase-locked loop.

9. The circuit of claim 1, wherein the phase adjuster comprises a phase-matched clock divider.

10. The circuit of claim 1, wherein the phase adjuster comprises an architecture-independent global buffer.

11. The circuit of claim 1, wherein the phase adjuster comprises a multiplexed global clock buffer.

12. A method of generating a plurality of clock signals, the method comprising:
receiving a plurality of copies of an input clock signal by a frequency adjuster;
confirming that the plurality of copies are phase-aligned; and
generating the plurality of clock signals in accordance with the plurality of copies when the plurality of copies is phase-aligned.

13. The method of claim 12, further comprising:
dividing down the plurality of copies prior to the confirming.

14. The method of claim 12, wherein the confirming comprises:
applying an XOR function to the plurality of copies to produce a signal, wherein the plurality of copies is deemed to be phase-aligned when the signal is low, and the plurality of copies is not deemed to be phase-aligned when the signal is high.

15. The method of claim 12, further comprising:
resetting the frequency adjuster that directly receives the plurality of copies prior to the generating.

16. The method of claim 12, further comprising:
resetting a phase adjuster that adjusts phases of the plurality of copies prior to the generating.

17. The method of claim 12, wherein the plurality of copies is frequency aligned prior to the receiving.

18. The method of claim 12, further comprising:
outputting the plurality of clock signals to a logic fabric of an integrated circuit.

19. The method of claim 12, wherein the plurality of clock signals is frequency-aligned.

20. A non-transitory computer-readable storage medium having stored thereon a plurality of instructions, the plurality of instructions including instructions which, when executed by a processor, cause the processor to perform steps of a method for generating a plurality of clock signals, comprising:
receiving a plurality of copies of an input clock signal by a frequency adjuster;
confirming that the plurality of copies are phase-aligned; and
generating the plurality of clock signals in accordance with the plurality of copies when the plurality of copies is phase-aligned.

* * * * *